(12) United States Patent
Wolf et al.

(10) Patent No.: US 6,680,493 B1
(45) Date of Patent: Jan. 20, 2004

(54) ESD PROTECTIVE TRANSISTOR

(75) Inventors: Heinrich Wolf, Unterschleissheim (DE); Wolfgang Wilkening, Pfullingen (DE); Stephan Mettler, Reutlingen (DE)

(73) Assignees: Fraunhofer-Gesellschaft zur Foerderung der Angewandten Forschung e.V., Munich (DE); Robert Bosch GmbH, Stuttgart-Feuerbach (DE)

( * ) Notice: Subject to any disclaimer, the term of this patent is extended or adjusted under 35 U.S.C. 154(b) by 0 days.

(21) Appl. No.: 09/889,336

(22) PCT Filed: Dec. 30, 1999

(86) PCT No.: PCT/EP99/10481

§ 371 (c)(1),
(2), (4) Date: Oct. 20, 2001

(87) PCT Pub. No.: WO00/42658

PCT Pub. Date: Jul. 20, 2000

(30) Foreign Application Priority Data

Jan. 15, 1999 (DE) .......................... 199 01 480
Oct. 21, 1999 (DE) .......................... 199 50 811

(51) Int. Cl.$^7$ ...................... H01L 29/74; H01L 27/082
(52) U.S. Cl. ...................... 257/173; 257/587
(58) Field of Search .................. 257/173, 355, 257/546–547, 587–589, 565, 356–363

(56) References Cited

U.S. PATENT DOCUMENTS

| | | | | |
|---|---|---|---|---|
| 5,341,005 A | * | 8/1994 | Canclini | 257/173 |
| 5,343,053 A | * | 8/1994 | Avery | 257/173 |
| 5,394,019 A | * | 2/1995 | Audy | 327/525 |

FOREIGN PATENT DOCUMENTS

| | | | | |
|---|---|---|---|---|
| DE | 197 46 410 | 10/1997 | | H01L/23/60 |
| EP | 532 481 | 3/1993 | | H01L/27/02 |

* cited by examiner

*Primary Examiner*—Tom Thomas
*Assistant Examiner*—Ori Nadav
(74) *Attorney, Agent, or Firm*—Glenn Patent Group; Michael A. Glenn

(57) ABSTRACT

An ESD protective transistor comprises a heavily doped p-type base region which is arranged in a lightly doped p-well and which is provided with a first terminal. Furthermore, a heavily doped n-type emitter region is arranged in the lightly doped p-well. A heavily doped n-type collector region is separated from the lightly doped p-well through a lightly doped n-type region and is provided with a second terminal. The heavily doped n-type emitter region is not short-circuited with the heavily doped base region viy a common electrode and is of floating design. The doping types of the respective regions may be reversed.

6 Claims, 3 Drawing Sheets

ESD PROTECTIVE TRANSISTOR

BACKGROUND OF THE INVENTION

1. Field of the Invention

The invention relates to an ESD protective transistor and in particular to an ESD protective transistor for protecting integrated circuits (ICs) against electrostatic discharge (ESD).

2. Description of Prior Art

For mixed processes, there are available protective elements with different breakdown voltages determined by technological parameters, which are designed for the corresponding supply voltages. Such supply voltages may be, for example, 6V, 12V or 20V. If a higher supply voltage is necessary for an application, these elements cannot be used any more.

In case of such applications it is possible, for example, to make use of MOS transistors the drain electrode and gate electrode of which are actively clamped by means of Zener diodes. However, such known ESD protection devices require very much space and thus involve high costs.

Another known ESD protection device is described, for example, in DE 19746410 A1 which teaches the use of a vertical bipolar transistor the breakdown voltage of which can be matched to the demanded supply voltage by a suitable layout measure. Such a vertical transistor is shown in FIG. 5, in which a heavily doped p+ base region 2 and a heavily doped n+ emitter region 4 are arranged in a lightly doped p-well 6 formed in a semiconductor substrate 8. Furthermore, there is provided a buried, heavily doped n+ collector layer 10 that is separated from p-well 6 by a lightly doped n-type region 12. The buried n+ collector layer 10 is connected via a vertical n+ diffusion 14 to a heavily doped n+ region 16 in the surface of substrate 8. The heavily doped n+ region 16 is provided with a collector electrode 18, whereas the base region 2 and the emitter region 4 are short-circuited via a base-emitter electrode 20. According to said DE 19746410 A1, the distance a between the heavily doped n+ region 16 and the lightly doped p-well is adjusted such that an avalanche breakdown voltage between these regions is determined by the lateral distance a, and not by the procedurally necessitated vertical distance between buried layer 10 and p-well 6. The base region 2 and the emitter region 4 are shorted so that, after onset of the avalanche breakdown on the collector side, the p-well 6 is charged so that the vertical transistor can trigger. In this manner, very low-impedance behavior is obtained.

The disadvantage of the structure shown in FIG. 5 is the fixed holding voltage defined by the non-variable base width and base doping of the vertical transistor. In case of the element illustrated in FIG. 5, this is due to the fact that the base region 2 and the emitter region 4 are shorted so that, after breakdown of the space charge region on the collector side, the transistor effect commences and the element snaps back to its specific holding voltage determined by the base width.

To safely exclude permanent switching on of the protective transistor during regular operation, however, it is necessary to have a holding voltage that is above the supply voltage of the integrated circuit.

U.S. Pat. No. 5,268,588 discloses a semiconductor structure for protection against electrostatic discharge, comprising two bipolar transistors and one field effect transistor. The emitter of the first bipolar transistor is connected to the collectors of the first and second bipolar transistors, whereas the emitter of the second bipolar transistor is connected to a reference voltage potential.

EP 0 822 596 A discloses a semiconductor circuit with ESD protection, with an ESD protection circuit being formed by an npnp semiconductor structure representing an npn transistor and a pnp transistor connected thereto, with the emitter of the npn transistor being connected to a first potential and the emitter of the pnp transistor being connected to a substrate potential.

The document WO 94/03928 A is concerned with a semiconductor high-voltage protection circuit comprising a plurality of bipolar transistors the emitters of which are connected to external terminals each.

Chen J. Z. et al. in "Design and Layout of a High ESD Performance NPN Structure for Submicron BICMOS/Bipolar Circuits", 1966 IEEE International Reliability Physics Proceedings, U.S., New York, vol. SYMP. 34, 1996, pages 227 to 232, describe circuits for protection against electrostatic discharges in which the emitter of a protective transistor is connected to ground.

Corsi M. et al., "ESD Protection of BICMOS Integrated Circuits Which Need to Operate in the Harsh Environments of Automotive or Industrial", Electrical Overstress/Electrostatic Discharge Symposium Proceedings, Lake Buena Vista, Fla., USA, Sep. 28 to 30, 1993, pages 209 to 213, also reveal ESD protection circuits in which one or more bipolar transistors are connected between a connecting pad and ground.

SUMMARY OF THE INVENTION

It is the object of the present invention to make available an ESD protective transistor providing space-saving ESD protection for integrated circuits with high operating voltages.

This object is met by an ESD protective transistor comprising a heavily doped p-type base region which is arranged in a lightly doped p-well and which is provided with a first terminal. In the lightly doped p-well, there is provided furthermore a heavily doped n-type emitter region. A heavily doped n-type collector region is separated from the lightly doped p-well by a lightly doped n-type region and is provided with a second terminal. In the ESD protective transistor according to the invention, the heavily doped n-type emitter region is not shorted with the heavily doped base region via a common electrode and, furthermore, is of floating design.

As an alternative, the doping types of the respective regions may be reversed.

The present invention is based on the finding that an ESD protective transistor with increased holding voltage can be provided if the emitter region of the ESD protective transistor is not provided with an external terminal. The inventors have recognized that in case of the known ESD protective element illustrated in FIG. 5, after onset of the avalanche breakdown on the collector side, the pn base-emitter diode will be polarized in flow or forward direction due to the voltage drop arising across the p-well, since base region and emitter region are shorted via a common electrode. After onset of the avalanche breakdown on the collector side, the element thus snaps back to its specific holding voltage defined by the ratio between the current gain of the collector-side avalanche breakdown (avalanche multiplication) and the current gain due to the transistor effect. However, this holding voltage may be below the operating voltage of the integrated circuit to be protected, so that switching on of the protective transistor during regular operation cannot be excluded with certainty.

According to the invention, the heavily doped base region and the heavily doped emitter region of the ESD protective transistor now are no longer shorted via a common electrode. Thus, after onset of the collector-side avalanche breakdown, there is no longer a pure flow polarization of the base-emitter junction, as in case of the element illustrated in FIG. 5, but rather parts of the base-emitter junction are operated in reverse direction due to the potential between grounded base region and non-connected emitter region, so that the onset of the transistor effect commences only with the breakdown of the base-emitter diode. Due to this transistor effect, the ESD protective element according to the invention snaps back to a holding voltage that is higher, by the amount of the base/emitter breakdown voltage, than in case of an ESD protective transistor in which base and emitter are shorted by a common electrode.

In preferred embodiments of the ESD protective transistor according to the invention, the base region and the emitter region are arranged in the base well in spaced apart manner, so that the breakdown voltage of the base-emitter diode can be adjusted by way of the spacing therebetween. Furthermore, in preferred embodiments of the ESD protective transistor the breakdown voltage of the collector-side avalanche breakdown can be adjusted by adjusting the lateral distance between heavily doped collector region and lightly doped base well.

The present invention thus provides an ESD protective transistor having an increased holding voltage as compared to known ESD protective transistors, with this holding voltage in preferred embodiments of the present invention being adjustable in layout to voltages above a demanded supply voltage by way of the distance between base region and emitter region in the base well. The structure according to the invention thus is suitable as ESD protection for higher voltages, without the possibility of switching on during regular operation of the integrated circuit. This leads to a considerable decrease of the susceptibility to interference in case of fluctuations in supply voltage. The reduced requirement of area as compared with solution approaches so far contributes to significant cost reduction in addition.

Further developments of the invention are indicated in the dependent claims.

BRIEF DESCRIPTION OF THE DRAWINGS

Preferred embodiments of the invention will be elucidated in more detail hereinafter with reference to the accompanying drawings in which.

DESCRIPTION OF PREFERRED EMBODIMENTS OF THE INVENTION

Figure 1:
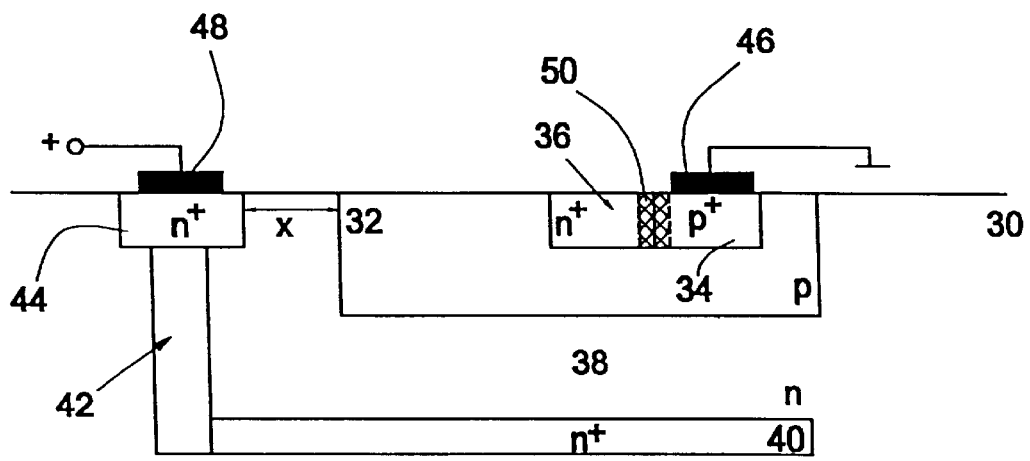
FIG. 1 shows a schematic cross-sectional view of a first embodiment of an ESD protective transistor according to the invention.

FIG. 1 illustrates the structure of a first embodiment of an ESD protective transistor according to the present invention.

It is to be noted first that the following embodiments of the present invention will be described with reference to specific doping types. However, it is evident to the experts that the doping types may be reversed as well.

As shown in FIG. 1, a surface of a semiconductor substrate 30 has a vertical transistor structure formed therein. Arranged in a lightly doped p-well 32 are a heavily doped p+ base region and a heavily doped n+ emitter region 36. A buried, heavily doped n+ collector layer 40 is separated from p-well 32 by a lightly doped n-type region 38 and is connected, via a heavily doped n+ sinker 42, to a heavily doped n+ collector region 44 formed by lateral diffusion. In preferred embodiments of the ESD protective transistor according to the invention, the collector-side avalanche breakdown voltage across the lightly doped n-type region 38 is adjustable by adjustment of the lateral distance x between heavily doped n+ region 44 and lightly doped p-well 32. It is to be noted in this respect that it is preferred for good adjustability to generate the n+ region 44 by lateral diffusion. Furthermore, surrounding the n+ region there may be arranged an n-type region (not shown) of high dopant density in the range of $1019/cm^3$ which by lateral diffusion can be generated with exact dimensions so that the distance x and thus also the avalanche breakdown voltage can be adjusted very accurately.

As can be seen from FIG. 1 furthermore, the base region 34 is provided with a first pad electrode 46, while the collector region 44 is provided with a second pad electrode 48. In contrast thereto, the emitter region 36 has no external terminal. The ESD protective element according to the invention has the terminals 46 and 48 connected between the input of an integrated circuit to be protected and mass, in order to dissipate an electrostatic discharge which exceeds a predetermined voltage and otherwise would be applied to the input of the integrated circuit, to mass. The ESD protective transistor preferably may be arranged on the same substrate as the integrated circuit.

In the vertical transistor illustrated in FIG. 1, the lightly doped n-type region 38 and the lightly doped p-well 32 form the pn junction on the collector side. As pointed out hereinbefore, the breakdown voltage of this junction is adjustable by layout measures, namely the adjustment of distance x. In the following, the mode of operation of the ESD protective transistor shown in FIG. 1 shall be elucidated briefly. As pointed out hereinbefore, the emitter of the ESD protective transistor of the invention is not connected, i.e. it is floating. Due to this, the structure first has the effect of a diode. If a sufficient reverse voltage is present between terminals 46 and 48, the potential between the base region 34 ground via terminal 46 and the non-connected emitter region 36 increases with increasing avalanche current across the collector-side pn junction. Due to the fact that emitter region 36 does not have an external terminal, the charge carriers therein cannot flow off, resulting in an increasing blocking potential between emitter 36 and base 34, which finally results in breakdown of the emitter-base diode, with the breakdown zone in FIG. 1 being illustrated by reference numeral 50. With this breakdown of the emitter-base diode, a bipolar transistor effect commences through which the ESD protective element snaps back to a holding voltage which is higher, by the amount of the base-emitter breakdown voltage, than in case of an ESD protective connector with shorted emitter and base.

Figure 2:
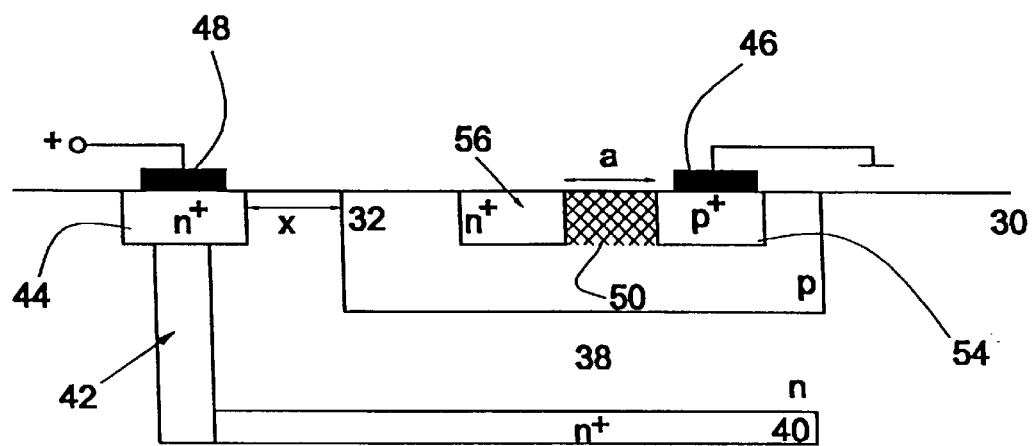
FIG. 2 shows a schematic cross-sectional view of a second embodiment of an ESD protective transistor according to the invention.

FIG. 2 illustrates an embodiment of the ESD protection device according to the invention, in which the holding voltage is further increased by provision of a distance a between the heavily doped p+ base region 54 and the heavily doped n+ emitter region 56 which are arranged in lightly doped p-well 32. As for the rest, the elements of the embodiment illustrated in FIG. 2 correspond to those described with respect to FIG. 1 and are designated with the same reference numerals. By providing a distance a between heavily doped base region 54 and heavily doped emitter region 56, the breakdown voltage of the base-emitter diode can be increased. Since, as pointed out hereinbefore, the holding voltage of the ESD protective transistor is dependent on the breakdown voltage of the base-emitter diode, it is thus possible to take influence on the holding voltage of the ESD protective transistor by corresponding adjustment of the distance a between heavily doped base region 54 and heavily doped emitter region 56. The lower limit of the breakdown voltage is determined by the p+/n+ junction with a=0 $\mu$m, which corresponds to the structure illustrated in FIG. 1. The upper limit is determined for a sufficiently large distance a by the junction between heavily doped n+ emitter region 56 and lightly doped p-well 32.

Since during an ESD load, parts of the base-emitter diode are operated in reverse direction as well, in addition to the space charge zone on the collector side, as outlined hereinbefore, the power transferred between base and emitter regions in addition can lead to a low failure threshold. It is thus expedient to select the space for the base-emitter breakdown as large as possible in order to thus reduce the power density occurring in this space charge zone between base and emitter regions.

Figure 3:
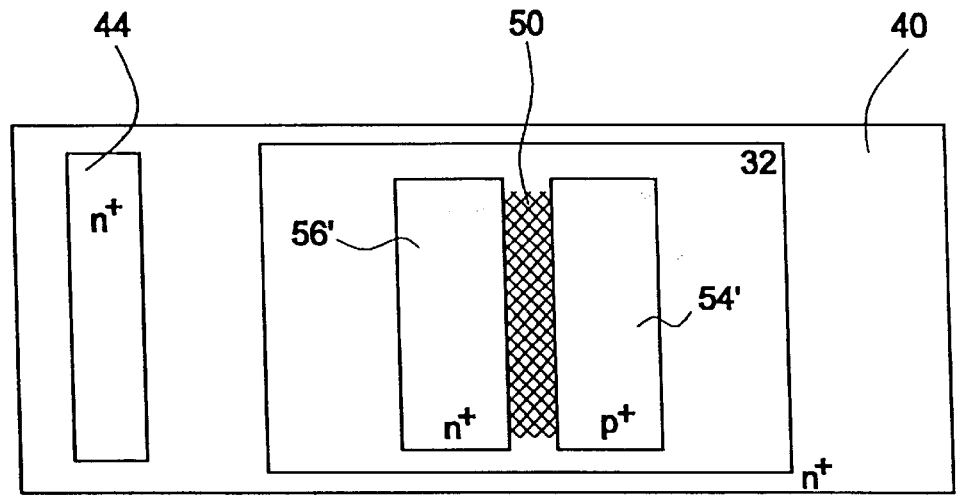
FIG. 3 shows a schematic plan view to illustrate another embodiment of an ESD protective transistor according to the invention.

FIG. 3 shows a plain first embodiment in which base region 54' and emitter region 56' are formed in elongate shape, so that they have enlarged opposing adjacent edge portions defining a space for base-emitter breakdown. The breakdown zone again is designated 50.

Figure 4:
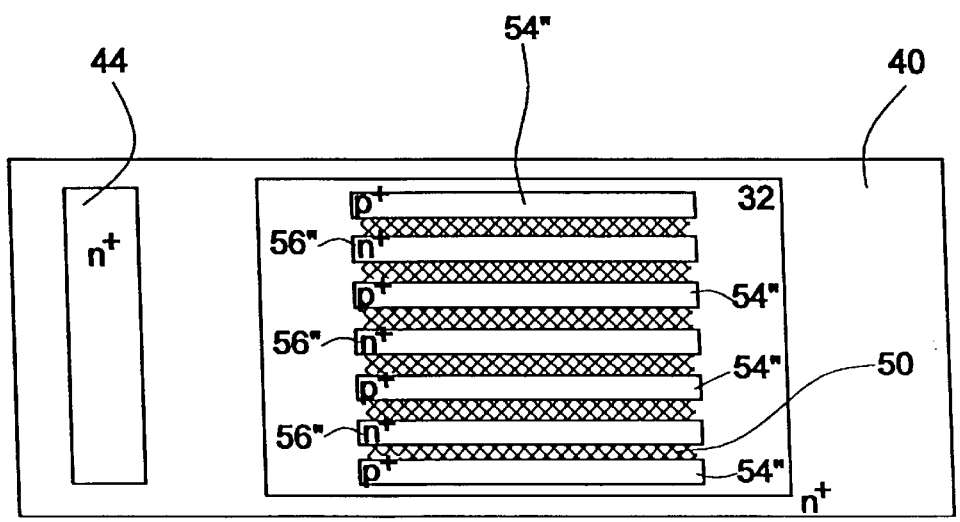
FIG. 4 shows a schematic plan view to illustrate still another embodiment of an ESD protective transistor according to the invention.
Figure 5:
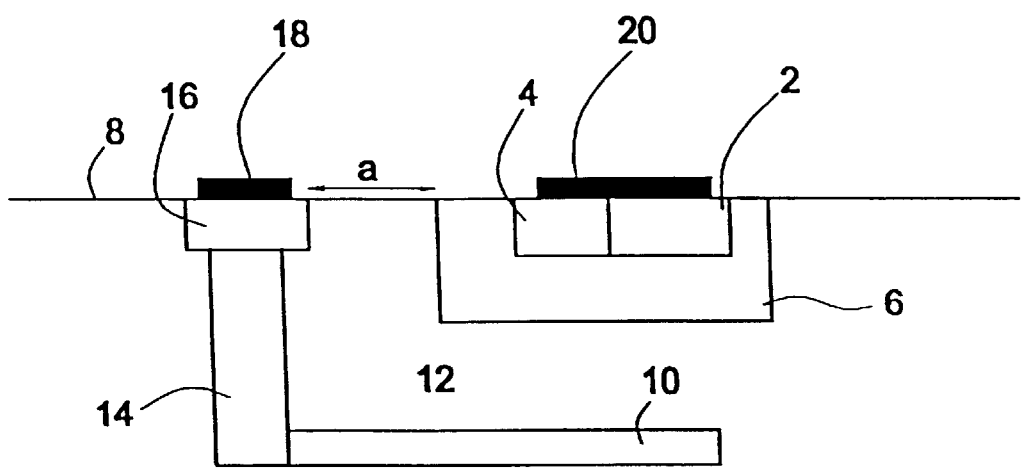
FIG. 5 shows a schematic cross-sectional view of a known ESD protective transistor.

FIG. 4 shows an additional embodiment for the layout of the base-emitter area, in which the space defined between opposing adjacent edge portions of base region 54' and emitter region 56" is substantially maximized for base-emitter breakdown. To this end, the embodiment illustrated in FIG. 4 has a plurality of elongate emitter regions 56" and elongate base regions 54" arranged with respect to each other such that intermediate spaces, defining a space for emitter-base breakdown, are arranged between the longitudinal sides thereof each. The power density across the base-emitter diode operated in reverse direction may thus be greatly reduced. In FIG. 4, only one breakdown zone disposed between a respective emitter region and base region bears the reference numeral 50.

The differently doped semiconductor regions of the ESD protective transistor according to the present invention may be doped with usual dopant levels. For example, the lightly doped p-well 32 may have a doping density of $10^{17}/cm^3$, whereas the doping density of lightly doped n-type region 38 may be $10^{15}/cm^3$. The heavily doped regions 34, 36 preferably have a doping density above $10^{19}/cm^3$.

The present invention thus provides ESD protective transistors with increased holding voltage, and in preferred embodiments the holding voltage is adjustable so as to be above a demanded supply voltage, by adjustment of the distance between base region and emitter region. The ESD protective element according to the invention thus is suitable for higher voltages, while it is ensured at the same time that it does not switch on during normal operation of the integrated circuit. The susceptibility to interference in case of fluctuations in supply voltage thus is reduced considerably. In addition thereto, a reduced space requirement as compared to conventional concepts also contributes to considerable cost reduction.

What is claimed is:

1. An ESD protective transistor for dissipating an electrostatic discharge between a first terminal and a second terminal, comprising the following features:
    a heavily doped base region of a first doping type arranged in a lightly doped well of said first doping type and provided with the first terminal;
    a heavily doped emitter region of a second doping type arranged in said lightly doped well of the first doping type; and
    a heavily doped collector region of the second doping type separated from said lightly doped well of the first doping type by a lightly doped region of the second doping type and provided with the second terminal,
    wherein the emitter region, the lightly doped well of the first doping type and the lightly doped region of the second doping type are arranged to form a vertical bipolar transistor, and
    wherein the heavily doped emitter region of the second doping type is not shorted together with the heavily doped base region of the first doping type via a common electrode and does not have any external connection.

2. An ESD protective transistor according to claim 1, wherein the heavily doped base region of the first doping type and the heavily doped emitter region of the second doping type are arranged in the lightly doped well of the first doping type in spaced apart manner.

3. An ESD protective transistor according to claim 1, which is a vertical transistor having a buried collector region.

4. An ESD protective transistor according to claim 3, wherein the buried collector region extends as far as a heavily doped surface region of the second doping type which is formed in the surface of the substrate having the ESD protective transistor formed therein- and on which said second terminal is arranged, the avalanche breakdown voltage between the lightly doped well of the first doping type and the heavily doped collector region of the second doping type across the lightly doped region of the second doping type being defined by a lateral distance between the heavily doped surface region of the second doping type and the lightly doped well of the first doping type.

5. An ESD protective transistor according to claim 1, wherein the base region and the emitter region are formed such that a space defined between opposing adjacent edge portions of the base region and the emitter region is maximized for a base-emitter breakdown.

6. An ESD protective transistor according to any of claims 1, wherein the first doping types is a p-doping and the second doping type is a n-doping.

* * * * *